(12) United States Patent
Arai

(10) Patent No.: US 6,288,487 B1
(45) Date of Patent: *Sep. 11, 2001

(54) ORGANIC ELECTROLUMINESCENT DEVICE WITH A HIGH-RESISTANCE INORGANIC ELECTRON INJECTING AND TRANSPORTING LAYER

(75) Inventor: Michio Arai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/344,805

(22) Filed: Jun. 25, 1999

(30) Foreign Application Priority Data

Mar. 17, 1999 (JP) .................................................. 11-071785

(51) Int. Cl.[7] ................................ H01J 1/62; H01J 63/04
(52) U.S. Cl. .......................... 313/506; 313/503; 313/504; 313/509; 313/498
(58) Field of Search .................................... 313/506, 503, 313/504, 509, 498

(56) References Cited

U.S. PATENT DOCUMENTS

| 5,457,565 | 10/1995 | Namiki et al. ........................ 359/273 |
| 5,739,635 | 4/1998 | Wakimoto ............................ 313/504 |

FOREIGN PATENT DOCUMENTS

| 0 423 283 | 4/1991 | (EP) . |
| 4-276668 | 10/1992 | (JP) . |
| 5-3080 | 8/1993 | (JP) . |
| 5-343183 | 12/1993 | (JP) . |
| 6-163158 | 6/1994 | (JP) . |
| 8-288069 | 11/1996 | (JP) . |
| 9-17574 | 1/1997 | (JP) . |
| 10-92577 | 4/1998 | (JP) . |
| 10-125474 | 5/1998 | (JP) . |
| 10-270172 | 10/1998 | (JP) . |
| 10-92576 | 10/1998 | (JP) . |

OTHER PUBLICATIONS

S. Tokito, et al., Journal of Physics D, vol. 29, No. 11, pp. 2750–2753, "Metal Oxides as a Hole–Injecting Layer for an Organic Electro Luminescent Device," Nov. 14, 1996.

Primary Examiner—Vip Patel
Assistant Examiner—Kevin Quarterman
(74) Attorney, Agent, or Firm—Oblon, Spivak, McClelland, Maier & Neustadt, P.C.

(57) ABSTRACT

The object of the invention is to provide an organic EL device which possesses the merits of both an organic material and an inorganic material, has high efficiency and an extended life, and can be fabricated at low cost. This object is achieved by the provision of an organic EL device which comprises a pair of a hole injecting electrode 2 and a cathode 6 and an organic layer 4 interleaved between these electrodes and having at least a light emission function, organic layer 4 comprising a light emitting layer containing a conjugated polymer, and a high-resistance inorganic electron injecting and transporting layer 5 interleaved between organic layer 4 and cathode 6 and including a conduction path for blocking holes and transporting electrons.

14 Claims, 2 Drawing Sheets

US 6,288,487 B1

ORGANIC ELECTROLUMINESCENT DEVICE WITH A HIGH-RESISTANCE INORGANIC ELECTRON INJECTING AND TRANSPORTING LAYER

BACKGROUND OF THE INVENTION

1. Art Field

The present invention relates generally to an organic EL (electroluminescent) device, and more specifically to an inorganic/organic junction structure used for a device comprising an organic compound thin film which emits light at an applied electric field.

2. Background Art

An organic EL device is now under development and investigation so that it can be used for display purposes, because it can be formed over a large area. In general, an organic EL device is basically built up of an ITO or other transparent electrode formed on a glass substrate, an organic amine base hole transporting layer laminated on the transparent electrode, an organic light emitting layer formed of a material having electronic conductivity and giving out strong light emission, for instance, an $Alq^3$ material, and an electrode provided on the organic light emitting layer and formed of a material having a low work function, for instance, an MgAg material.

As reported so far in the art, the device has a structure wherein one or plural organic compound layers are interleaved between a hole injecting electrode and an electron injecting electrode. The organic compound layer has a double- or triple-layer structure.

Examples of the double-layer structure are a structure wherein a hole transporting layer and a light emitting layer are formed between the hole injecting electrode and the electron injecting electrode, and a structure wherein a light emitting layer and an electron transporting layer are formed between the hole injecting electrode and the electron injecting electrode. In an exemplary triple-layer structure, a hole transporting layer, a light emitting layer and an electron transporting layer are provided between the hole injecting electrode and the electron injecting electrode. A single-layer structure wherein a single layer has all functions, too, is reported in conjunction with a polymer or mixture system.

Typical structures of the organic EL device are shown in FIGS. 3 and 4.

In FIG. 3, a hole transporting layer 14 and a light emitting layer 15, each made of an organic compound, are formed between a hole injecting electrode 12 provided on a substrate 11 and an electron injecting electrode 13. In this case, the light emitting layer 15 also functions as an electron transporting layer.

In FIG. 4, a hole transporting layer 14, a light emitting layer 15 and an electron transporting layer 16, each made of an organic compound, are formed between a hole injecting electrode 12 provided on a substrate 11 and an electron injecting electrode 13.

A problem common to these organic EL devices is reliability. In principle, an organic EL device comprises a hole injecting electrode and an electron injecting electrode and requires an organic layer for efficient injection and transportation of holes and electrons from between these electrodes. However, these materials are sensitive to damages during device fabrication, and offer a problem in conjunction with an affinity for electrodes. Another problem is that the deterioration of an organic thin film is much severer than that of an LED or LD.

An electroluminescent (EL) device emits light under the influence of an electric field. The action of a semiconductor layer forming such an EL manifests itself through radiative combination of electron-hole pairs injected from a pair of electrodes into the semiconductor. One example of this is a light emitting diode based on a GaP semiconductor or other similar group III-V semiconductor. Although these devices are utilized effectively and in wide fields, yet application thereof to large-area displays is not only difficult but also uneconomical because their size is very minute. Some replacements applicable to large-area displays are known in the art. Of such inorganic semiconductors, ZnS is the most useful. However, one non-negligible practical problem with this system is that it is poor in reliability. In one mechanism to which ZnS relates, a kind of carrier is accelerated through the semiconductor in a strong electric field. This is believed to cause local excitation of the semiconductor, which decays upon radiative emission.

Of organic materials, simple aromatic molecules such as anthracene, perylene and coronene are known to show electro-luminescence.

Practical problems with these materials are that they do not only lack reliability as is the case of ZnS, but it is also difficult to bond organic layers formed thereof to a current-injecting electrode layer.

A problem with techniques of sublimating or otherwise treating organic materials is that the resultant layer is susceptible to re-crystallization due to its softness.

Techniques such as Langmuir-Blodgett evaporation of suitably modified aromatic compounds give rise to degradation of films, dilution of active substances, and production cost increases.

An electroluminescent device making use of anthracene is disclosed in U.S. Pat. No. 3,621,321. Disadvantages of this device are that much power is consumed in spite of low luminescence.

With a view to providing an improved device, U.S. Pat. No. 4,672,265 describes an electroluminescent device having a double-layer structure of light emitting layer.

However, substances proposed for the double-layer structure are organic materials having such disadvantages as mentioned above.

JP-A 10-92576 discloses an electroluminescent device comprising a thin yet intimate polymer film form of semiconductor layer comprising at least one conjugated polymer, a first contact layer coming into contact with a first surface of the semiconductor layer and a second contact layer coming into contact with a second surface of the semiconductor layer. The polymer film of the semiconductor layer has external charge carriers at a concentration so sufficiently low that when an electric field is applied between the first and second contact layers by way of the semiconductor layer while the second contact layer is positive with respect to the first contact layer, the charge carriers can be injected in the semiconductor layer to emit light from the semiconductor layer.

The conjugated polymer per se, too, is known in the art, and a practical application of the polymer to an optical modulator is put forward in, for instance, European Patent Application No. 0294061. In this case, polyacetylene is used as an active layer in a modulation structure between the first and second electrodes. It is then required that between one electrode and the active layer there be provided an insulating layer so as to form a spatial charge area in the active layer contributing to optical modulation effect. However, the presence of the spatial charge layer makes it impossible to achieve an electron/hole pair which decays to emit light. In other words, such a structure cannot possibly show electroluminescence. In any case, the fact that electroluminescence is obtained in European Patent Application No. 0294061 is quite undesired because the optical modulation effect is destroyed thereby.

To provide a solution to such problems, methods of taking advantage of merits of both an organic material and an inorganic semiconductor material have been envisaged. That is, an organic/inorganic semiconductor junction structure wherein an organic hole transporting layer is substituted by an inorganic p-type semiconductor has been contemplated. Such contemplation has been investigated in Japanese Patent No. 2636341, and JP-A's 2-139893, 2-207488 and 6-119973. However, it is still difficult to obtain an organic EL device superior to prior art organic ELs in terms of emission performance and basic device reliability.

SUMMARY OF THE INVENTION

One object of the invention is to provide an organic EL device which possesses the merits of both an organic material and an inorganic material, has high efficiency and an increased service life, and can be fabricated at low cost.

The above object is achieved by the embodiments defined below.

(1) An organic EL device which comprises:

a pair of a hole injecting electrode and a cathode and an organic layer interleaved between these electrodes and having at least a light emission function, said organic layer comprising a light emitting layer containing a conjugated polymer, and a high-resistance inorganic electron injecting and transporting layer interleaved between said organic layer and said cathode and being capable of blocking holes and having conduction paths for carring electrons.

(2) The organic EL device according to (1), wherein said high-resistance inorganic electron injecting and transporting layer comprises as a first component at least one oxide having a work function of 4 eV or lower and selected from the group consisting of an alkali metal element, an alkaline earth metal element, and a lanthanide element, and as a second component at least one metal having a work function of 3 to 5 eV.

(3) The organic EL device according to (1), wherein said second component is at least one element selected from the group consisting of Zn, Sn, V, Ru, Sm, and In.

(4) The organic EL device according to (1), wherein said alkali metal element is at least one of Li, Na, K, Rb, Cs, and Fr, said alkaline earth metal element is at least one of Mg, Ca, and Sr, and said lanthanide element is at least one selected from the group consisting of La, and Ce.

(5) The organic EL device according to (1), wherein said high-resistance inorganic electron injecting and transporting layer has a resistivity of 1 to $1 \times 10^{11}$ Ω·cm.

(6) The organic EL device according to (1), wherein said high-resistance inorganic electron injecting and transporting layer contains said second component in an amount of 0.2 to 40 mol % relative to all components thereof.

(7) The organic EL device according to (1), wherein said high-resistance inorganic electron injecting and transporting layer has a thickness of 0.2 to 30 nm.

(8) The organic EL device according to (1), wherein a high-resistance inorganic hole injecting and transporting layer between said organic layer and said hole injecting electrode and being capable of blocking electrons and having conduction path for carring electrons.

(9) The organic EL device according to (8), wherein said high-resistance inorganic hole injecting and transporting layer has a resistivity of 1 to $1 \times 10^{11}$ Ω·cm.

(10) The organic EL device according to (8), wherein said high-resistance inorganic hole injecting and transporting layer contains at least one of a metal and/or an oxide, carbide, nitride, silicide and boride of said metal.

(11) The organic EL device according to (8), wherein said high-resistance inorganic hole injecting and transporting layer contains as a main component an oxide of silicon and/or germanium as represented by $(Si_{1-x}Ge_x)O_y$ where $0 \leq x < 1$ and $1.7 \leq y \leq 2.2$, and further contains at least one of a metal having a work function of at least 4.5 eV and/or an oxide, carbide, nitride, silicide and boride of said metal.

(12) The organic EL device according to (10), wherein said metal is at least one selected from Au, Cu, Fe, Ni, Ru, Sn, Cr, Ir, Nb, Pt, W, Mo, Ta, Pd, and Co.

(13) The organic EL device according to (10), which contains said metal and/or said oxide, carbide, nitride, silicide and boride of said metal in an amount of 0.2 to 40 mol %.

(14) The organic EL device according to (8), wherein said high-resistance inorganic hole injecting and transporting layer has a thickness of 0.2 to 100 nm.

ADVANTAGES

Figure 1:
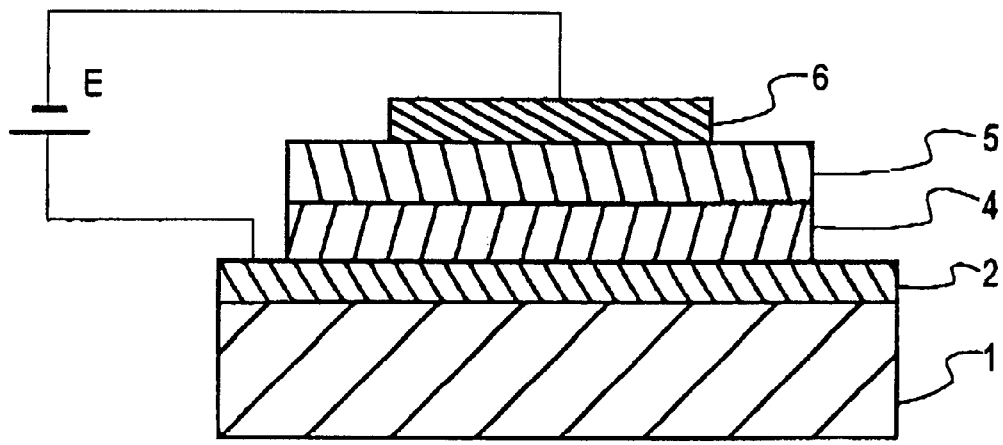
FIG. 1 is a sectional schematic of one basic embodiment of the organic EL device according to the invention.

In the organic EL device of the invention, it is preferable to use poly(p-phenylenevinylene) for the conjugated polymer used in the light emitting layer. Preferably, the polymer film should have a uniform thickness in the range of approximately 10 nm to approximately 5 μm and the conjugated polymer should have a semiconductor band gap in the range of 1 eV to 3.5 eV. It is also preferable that the proportion of the conjugated polymer in an electroluminescent area of the polymer film is high enough to ensure migration of charges in the conjugated polymer present in the polymer film.

By the "conjugated polymer" used herein is meant a polymer having a delocalized π electron system along a main skeleton of the polymer. This delocalized π electron system imparts semiconduction to the polymer, and furnishes the polymer with the ability to carry positive and negative charge carriers having a high mobility along the polymer skeleton.

Such polymers are reviewed in R. H. Friend, Journal of Molecular Electronics, 4(1988), January–March, No. 1, pp. 36–46.

In the organic EL device, the hole injecting electrode and hole injecting layer inject positive charge carriers in the polymer film, while the electron injecting electrode and electron injecting layer inject negative charge carriers in the polymer film. These charge carriers form a charge pair which couples together and decays in a radiative way. For this reason, a selection should be made such that the hole injecting electrode has a high work function while the electron injecting electrode has a low work function.

To obtain the desired electroluminescence, it is preferable that the polymer film is substantially free from a defect acting as the center of non-light emitting recombination. The defect has an adverse influence on an electroluminescent action.

In the invention, at least one high-resistance inorganic hole injecting and transporting layer should be provided. The high-resistance inorganic hole injecting and transporting layer or the organic electron injecting and transporting layer is useful to ensure that the electron-to-hole ratio upon injected in the electroluminescent layer is controlled and radiative decay occurs away from each layer.

Preferably, the conjugated polymer film should be built up of a single conjugated polymer or a single copolymer containing a conjugated polymer segment. Alternatively, the conjugated polymer film may be made up of a mixture of a conjugated polymer or copolymer with other suitable polymer.

The polymer film according to the invention has the following preferable features.
(i) The polymer is stable against exposure to oxygen, humidity, and high temperature.
(ii) The polymer film has good adhesion to the underlying layer, is capable of preventing cracks ascribable to temperature increases and compression, and is resistant to shrinkage, expansion, recrystallization and other morphological changes.
(iii) The polymer film has high crystallinity and high melting point, for instance, and so can be restored to its original state against an ion/atom migration process.

EXPLANATION OF THE PREFERRED EMBODIMENTS

The organic EL device according to the invention comprises a pair of a hole injecting electrode and a cathode, an organic layer interleaved between these electrodes and taking part in at least a light emitting function, said organic layer including a light emitting layer comprising a conjugated polymer, and a high-resistance inorganic electron injecting layer interleaved between the organic layer and the cathode.

Usually but not exclusively, the cathode (electron injecting electrode) may be formed of ordinary metals because when combined with the following high-resistance inorganic electron injecting layer, it is possible to use a material having a low work function and no ability to inject electrons. In view of conductivity and ease of handling, it is preferable to use one or two or more metal elements selected from Al, Ag, In, Ti, Cu, Au, Mo, W, Pt, Pd and Ni, and especially Al and Ag.

The cathode thin film should preferably have at least a certain thickness sufficient to impart electrons the high-resistance inorganic electron injecting and transporting layer or a thickness of at least 50 nm, and especially at least 100 nm. Although there is usually no upper limit to thickness, the cathode thin film should usually have a thickness of the order of 50 to 500 nm.

For the electron injecting electrode material, the following materials may be used if required. For instance, use may be made of pure metal elements such as K, Li, Na, Mg, La, Ce, Ca, Sr, Ba, Sn, Zn, and Zr, and a binary or ternary alloy system serving as a stabilizer and containing these elements. Exemplary alloys are Ag·Mg (Ag: 0.1 to 50 at %), Al·Li (Li: 0.01 to 14 at %), In·Mg (Mg: 50 to 80 at %), and Al·Ca (Ca: 0.01 to 20 at %).

The electron injecting electrode thin film should preferably have at least a certain thickness enough to inject electrons or a thickness of at least 0.1 nm, preferably at least 0.5 nm, and more preferably at least 1 nm. Although there is no particular upper limit to the electron injecting electrode thickness, the electron injecting electrode may usually have a thickness of the order of 1 to 500 nm. Additionally, an auxiliary electrode (protective electrode) may be located on the electron injecting electrode.

The auxiliary electrode should preferably have at least a certain thickness enough to ensure electron injection efficiency and prevent entrance of moisture, oxygen or organic solvents or a thickness of preferably at least 50 nm, more preferably at least 100 nm, and even more preferably 100 to 500 nm. With too thin an auxiliary electrode, neither is its own effect obtainable, nor is sufficient connection with terminal electrodes obtainable because the ability of the auxiliary electrode to cover steps becomes low. When the auxiliary electrode is too thick, on the other hand, the growth rate of dark spots becomes unacceptably high because of an increase in the stress of the auxiliary electrode.

The auxiliary electrode should preferably be formed of the optimum material chosen depending on the electron injecting electrode material used in combination therewith.

For instance, a low-resistance metal such as Al may be used if it is important to make up for low electron injection efficiency of the electron injecting electrode, and a metal compound such as TiN may be used if emphasis is placed on sealability.

Preferably but not exclusively, the total thickness of the electron injecting electrode plus the auxiliary electrode should usually be the order of 50 to 500 nm.

The hole injecting electrode should preferably be composed of a material that can efficiently inject holes in the high-resistance inorganic hole injecting and transporting layer or the organic hole injecting and transporting layer and has a work function of 4.5 eV to 5.5 eV, for instance, a material composed mainly of any one of tin-doped indium oxide (ITO), zinc-doped indium oxide (IZO), indium oxide ($In_2O_3$), tin oxide ($SnO_2$), and zinc oxide (ZnO) It is here to be noted that these oxides may deviate slightly from their stoichiometric compositions. Regarding ITO, it is desired that the mixing ratio of $SnO_2$ with respect to $In_2O_3$ be in the range of 1 to 20 wt %, and especially 5 to 12 wt %. Regarding IZO, the mixing ratio of ZnO with respect to $In_2O_3$ is usually in the range of about 12 to 32 wt %.

The hole injecting electrode may further contain silicon oxide ($SiO_2$) for work function control. The content of silicon oxide ($SiO_2$) should preferably be of the order of 0.5 to 10% in terms of the molar ratio of $SiO_2$ to ITO. The incorporation of $SiO_2$ contributes to an increase in the work function of ITO.

The electrode on the side out of which light is taken should preferably have a light transmittance of at least 50%, preferably at least 80%, and more preferably at least 90% with respect to light emitted at an emission wavelength of usually 400 to 700 nm. With decreasing transmittance, the light emitted from the light emitting layer attenuates, and so it is difficult to obtain the luminance needed for an light emitting device.

The electrode should preferably have a thickness of 50 to 500 nm, and especially 50 to 300 nm. Although there is no particular upper limit to the electrode thickness, too thick an electrode gives rise to concerns such as a transmittance drop, and defoliation. Too thin an electrode fails to obtain sufficient effect, and offers a problem in conjunction with film thickness, etc. during device fabrication.

The light emitting layer comprises a conjugated polymer which should preferably be poly(p-phenylenevinylene)

(PPV for short) represented by the following formula (I). In the formula given below, if required, the phenylene ring may independently have at least one substituent selected from the group consisting of an alkyl (preferably methyl), an alkoxy (preferably methoxy or ethoxy), a halogen (preferably chlorine or bromine), and a nitro.

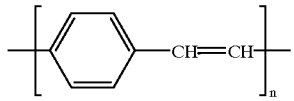
(I)

Other conjugated polymers derived from poly(p-phenylenevinylene), too, are suitable for use as the conjugated polymer for the organic EL device according to the invention.

Set out below are typical examples of such derivatives.
(i) Polymers which are obtained by substituting the phenylene ring in formula (I) by a fused ring system, for instance, an anthracene or naphthalene ring system and have such structures as represented by the following formulae (II) to (IV).

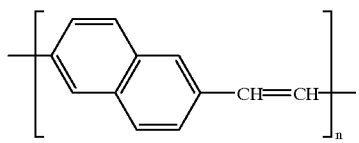
(II)

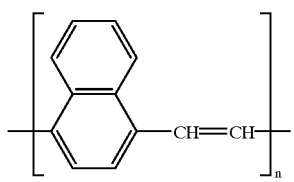
(III)

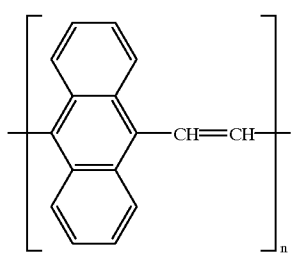
(IV)

Such polycyclic systems, too, may have one or two or more substituents as explained in conjunction with the phenylene ring.
(ii) A polymer which is obtained by substituting the phenylene ring by a heterocyclic system such as a furan ring and has such structure as represented by the following formula (V).

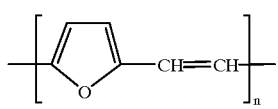
(V)

The aforesaid furan ring, too, may have one or two or more substituents as explained in conjunction with the phenylene ring.

(iii) Polymers which are obtained by increasing the number of vinylene moieties attached to one of respective phenylene rings (or other cyclic systems as explained in conjunction with (i) or (ii)) and have such structures as represented by the following formulae (VI) to (VIII).

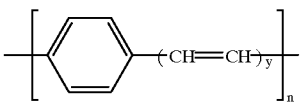
(VI)

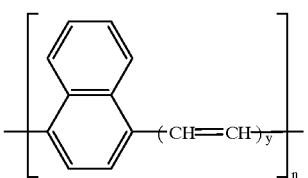
(VII)

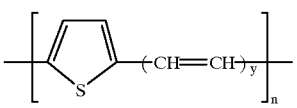
(VIII)

In each of the aforesaid structural formulae, y stands for 2, 3, 4, 5, 6 or 7. Usually, n=ca. 3 to ca. 10,000.

As in the foregoing, these cyclic systems may have various substituents as explained in conjunction with the phenylene ring.

These various PPV derivatives have different semiconductor energy gaps. By selecting PPVs having different semiconductor energy gaps and mixing them together, it is thus possible to obtain an electrcluminescent device which emits light at different wavelengths all over the visible spectral region.

The conjugated polymer film may be produced by chemical treatment and/or thermal treatment of a "precursor" polymer which can be processed in a solution or molten state. The latter precursor polymer may be purified or pre-processed into any desired shape before it is converted to a conjugated polymer by the subsequent elimination reaction.

By using a suitable sulfonium precursor, the aforesaid various PPV derivative films may be formed on an organic EL structure in the same manner as mentioned above.

In general or in some cases, the use of a polymer precursor having a high solubility in an organic solvent is more favorable than the use of the sulfonium salt precursor (II). The organic solvent solubility can be increased by substituting a sulfonium moiety in the precursor by a group of low hydrophilicity such as an alkoxy group (usually methoxy) or a pyridinium group.

Typically, the poly(phenylenevinylene) film can be provided on a substrate with electrodes and, if required, a hole injecting layer, an electron injecting layer, etc. provided thereon by a method based on such a reaction scheme as mentioned below.

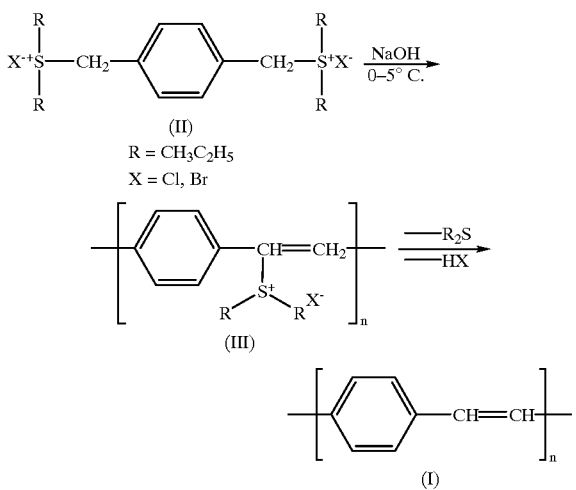

The sulfonium salt monomer (II) is synthesized to the precursor polymer (III) in an aqueous solution, a water/ethanol mixture or methanol. Such a prepolymer (III) solution may be provided on a substrate by means of general spin coating techniques used for photoresist processing in the semiconductor industry. This solution may also be provided on the substrate by means of other techniques such as casting, dipping, bar coating, and roll coating. Then, the obtained precursor polymer (III) film is usually heated to a temperature of 200° C. to 350° C. for conversion to the poly(phenylenevinylene) (I).

For the detailed conditions required for chemical synthesis of the monomer (II), polymerization of the monomer to the precursor (III), and thermal conversion of the precursor to PPV, for instance, see D. D. C. Bradley, J. Phys. D(Applied Physics), 20, 1389(1987) and J. D. Stenger Smith, R. W. Lenz and G. Wegner, Polymer, 30, 1048(1989).

The poly(phenylenevinylene) film should have a thickness of preferably 0.1 nm to 10 μm, more preferably 0.5 nm to 1 μm, and even more preferably 10 to 500 nm. This PPV film has little or no pinhole. The PPV film has a semiconductor energy gap of about 2.5 eV (500 nm). The PPV film is tough, only seldom reacts with oxygen at room temperature, and is stable with respect to atmospheres other than air at a temperature exceeding 300° C.

If the group to be eliminated from the precursor polymer is modified to ensure that the elimination reaction can proceed in the form of a single reaction without yielding another intermediate structure, the material can then be put in good sequence. Thus, an n-dialkylsulfonium component can be substituted by a tetrahydrothiophenium component, for instance. The latter component can be eliminated in the form of a single leaving group from the precursor polymer without being decomposed into alkylmercaptan, unlike dialkylsulfide. In the embodiment explained herein, the precursor polymer used includes both dimethylsulfide and tetratryebrothiophene chosen for the dialkylsulfonium component. Both the precursors yield a PPV film suitable for use with an organic EL device.

Preferable another material for forming the conjugated polymer film is poly(phenylene).

This material may be produced using a biochemically synthesized derivative of 5,6-dihydroxycyclohexa-1,3-diene as a starting material. This derivative may be polymerized in the presence of a radical initiator to a precursor polymer soluble in a single solvent. The production of this poly (phenylene) is described at great length in Ballard et al., J. Chem. Comm. 954(1983).

The polymer precursor solution is spin coated as a thin film on the substrate, and then usually heated to a temperature ranging from 140° C. to 240° C. for conversion to a conjugated poly(phenylene) polymer.

The phenylene copolymer may also be obtained by copolymerization using a vinyl or diene monomer.

Yet another material which may be used to form the conjugated polymer film is preferably a conjugated polymer that can be processed in either a solution state or a molten state due to the presence of a huge side chain group bonded to a main conjugated chain or the incorporation of the conjugated polymer into a copolymer structure containing one or more non-conjugated components. Given below are some examples of the former.

(a) Poly(4,4'-diphenylenediphenylvinylene)(PDPV)

This is an arylenevinylene polymer in which both vinylene carbons are substituted by phenyl rings, and can yield a thin film because of being soluble in an ordinary organic solvent.

(b) Poly(1,4-phenylene-1-phenylvinylene) polymer, and poly(1,4-phenylenediphenylvinylene) polymer These are PPV-related substances in which one or both vinylene carbons are substituted by phenyl groups, and yield a thin film upon cast or spin coating because of being soluble in an organic solvent.

(c) Poly(3-alkylthiophene) polymer where the alkyl is any one of propyl, butyl, pentyl, hexyl, heptyl, octyl, decyl, undecyl, dodecyl, etc.

This can be processed in an ordinary organic solvent solution, has a long alkyl sequence (wherein the alkyl is equal to or longer than octyl), and can be processed in a molten state as well.

(d) Poly(3-alkylpyrrole) polymer

This is expected to be analogous with the poly(3-alkylthiophene) polymer.

(e) Poly(2,5-dialkoxy-p-phenylenevinylene) polymer

This has an alkyl larger than butyl, and can be processed in a dissolved state.

(f) Poly(phenylacetylene)

This is a polyacetylene derivative wherein a hydrogen atom in a main chain is substituted by a phenyl group. By this substitution, the material is made soluble.

To obtain the processability required for polymer and make it easy to form a uniform thin film on a substrate (with electrodes and the necessary functional thin films formed thereon), it is sometimes preferable to use a polymer blend comprising the conjugated polymer and other polymer or polymers.

When such a copolymer or polymer blend is used in the formation of the conjugated polymer film, the active site of an electroluminescent device, in which the aforesaid conjugated polymer film is to be built, has to include a large amount of conjugated polymer site having a percolation threshold value that is the same as or larger than that of the copolymer or polymer blend.

The light emitting layer is provided in the form of a composite layer comprising a polymer layer having different band gaps and/or a number of charge species, and so the injection of charges can be concentrated, for instance, from the hole/electron injecting layer on the light emitting layer or on a specific area in the light emitting layer. The composite layer may be formed by continuous deposition of the polymer layer. When various films, each in a conjugate polymer precursor form, are deposited on the substrate by spin or draw coating, subsequent layers can similarly be deposited on the already deposited films without dissolution of the films, because the films are made insoluble at the step of conversion to the conjugated polymer.

Further, the following conjugated polymer, for which any thermal polymerization step is not needed, may be used for the light emitting layer according to the invention.

A solvent-soluble conjugated polymer may be used. More specifically, this conjugated polymer should have a number-average molecular weight of $10^3$ to $10^7$, and a structure with a continuous conjugated bond sequence. The conjugated polymer comprises at least two repeatinc units different from each other, each of which has at least one conjugated bond. Then, there should be a difference of at least 120 nm between the peak wavelengths of absorption and fluorescence spectra for a conjugated polymer thin film. Preferably in this case, the repeating unit in a homopolymer comprising repeating units of one single species, where optical absorption edge energy is minimized, should account for 0.01 mol % to 40 mol %, both inclusive, of the conjugated polymer. The number-average molecular weight used herein is understood to refer to a number-average molecular weight on a polystyrene basis, as found by gel permeation chromatography (GPC).

With the view of obtaining a conjugated polymer fluorescent substance having high fluorescent quantum efficiency, the conjugated polymer fluorescent substance should preferably comprise such repeating structures as represented by the following formulae (1) to (3), and more preferably have a repeating structure wherein vinylene groups and aryl or heterocyclic compound groups are alternately bonded to each other, as represented by the following formula (4) or (5).

The repeating units in the conjugated polymer according to the invention should be selected from the group consisting of a divalent aromatic compound group or its derivative group, and a divalent heterocyclic compound group or its derivative group.

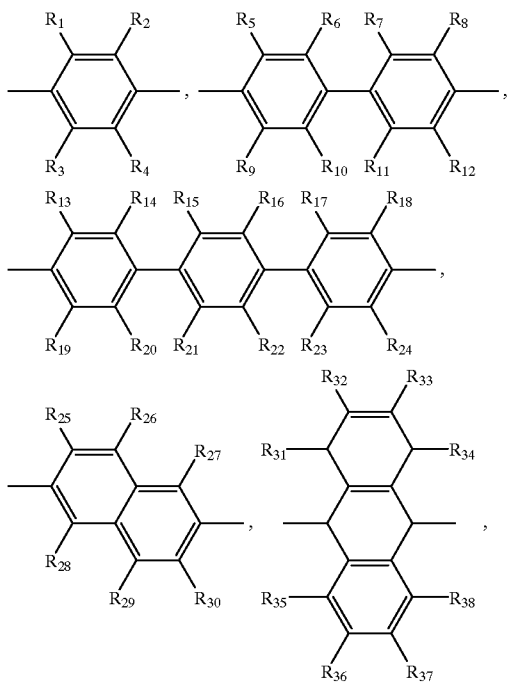

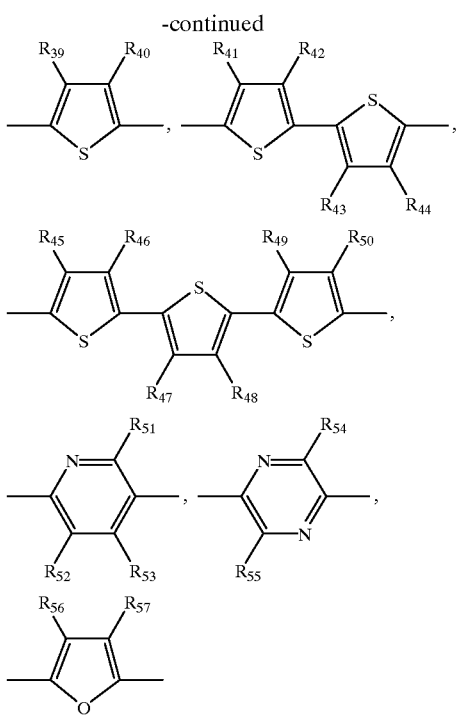

In the above-mentioned formulae, $R_1$ to $R_{57}$ are each independently a group selected from the (group consisting of hydrogen, an alkyl, alkoxy or alkylthio group having 1 to 20 carbon atoms, an aryl or aryloxy group having 6 to 18 carbon atoms, and a heterocyclic compound group having 4 to 14 carbon atoms.

For instance, groups in which a vinylene group is bonded to divalent aromatic compound groups or their derivative groups, and groups in which a vinylene group is bonded to divalent heterocyclic compound groups or their derivative groups are exemplified as represented by the following formulae (1) to (5).

Here, $Ar_1$, $Ar_2$, and $Ar_3$ are different from one another and are each an arylene or divalent heterocyclic compound group which forms a conjugated bond contiguous to the vinylene group, provided that at least one of $Ar_1$, $Ar_2$ and $Ar_3$ is an arylene or heterocyclic compound group having at least one substituent selected from the group consisting of an alkyl, alkoxy or alkylthio group having 4 through 22 carbon atoms, an aryl or aryloxy group having 6 through 60 carbon atoms, and a heterocyclic compound group having 4 through 60 carbon atoms.

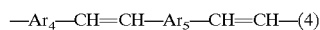

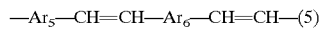

Here, $Ar_4$, $Ar_5$, and $Ar_6$ are different from one another and are each an arylene or divalent heterocyclic compound group which forms a conjugated bond contiguous to the vinylene group, provided that at least one of $Ar_4$, $Ar_5$ and $Ar_6$ is an arylene or heterocyclic compound group having at least one substituent selected from the group consisting of an alkyl, alkoxy or alkylthio group having 4 through 22 carbon atoms, an aryl or aryloxy group having 6 through 60 carbon atoms, and a heterocyclic compound group having 4 through 60 carbon atoms.

Of these groups, preference is given to a phenylene group, a substituted phenylene group, a biphenylene group, a substituted biphenylene group, a naphthalenediyl group, a substituted naphthalenediyl group, an anthracene-9,10-diyl group, a substituted anthracene-9,10-diyl group, a pyridine-2,5-diyl group, a substituted pyridine-2,5-diyl group, a thienylene group, and a substituted thienylene group, among which the phenylene, biphenylene, naphthalenediyl, pyridine-2,5-diyl, and thienylene groups are most preferred.

Here reference is made to the substituents. Exemplified for the alkyl groups having 1 to 20 carbon atoms are methyl, ethyl, propyl, butyl, pentyl, hexyl, heptyl, octyl, decyl, and lauryl groups, among which the methyl, ethyl, pentyl, hexyl, heptyl, and octyl groups are preferred. Exemplified for the alkoxy groups having 1 to 20 carbon atoms, methoxy, ethoxy, propoxy, butoxy, pentyloxy, hexyloxy, heptyloxy, octyloxy, decyloxy, and lauryloxy groups, among which the methoxy, ethoxy, pentyloxy, hexyloxy, heptyloxy, and octyloxy groups are preferred. Exemplified for the alkylthio groups are methylthio, ethylthio, propylthio, butylthio, pentylthio, hexylthio, heptylthio, octylthio, decylthio, and laurylthio groups, among which the methylthio, ethylthio, pentylthio, hexylthio, heptylthio, and octylthio groups are preferred. A phenyl group, 4-$C_1$ to $C_{12}$ alkoxyphenyl groups where $C_1$ to $C_{12}$ stand for 1 to 12 carbon atoms, 4-$C_1$ to $C_{12}$ alkylphenyl groups, a 1-naphthyl group, and a 2-naphthyl group are exemplfied fcr the aryl groups. 2-thienyl, 2-pyrolyl, 2-furyl, and 2-, 3- or 4-pyridyl groups are exemplfied for the heterocyclic compound groups.

By use of a conjugated polymer comprising a repeating unit selected from these and having a difference of at least 120 nm between the peak wavelengths of absorption and fluorescence spectra for a thin film, it is possible to obtain a light emitting material having high fluorescent quantum efficiency.

More preferably, use should be made of a copolymer which is a conjugated polymer selected from these repeating units, and in which the repeating unit where optical absorption edge energy is minimized is contained in an amount of 0.01 mol % to 40 mol % both inclusive. Even more preferably, a repeating unit which shows an optical absorption edge energy difference of at least 0.05 eV upon homopolymerization should be selected from these repeating units, because a light emitting material having particularly high fluorescent quantum efficiency can be obtained. To this end, a selection has to be made from at least two different chemical structures.

Further, $Ar_1$, $Ar_2$, and $Ar_3$ should preferably be selected from different chemical structures. Referring here to different repeating units having an optical absorption edge energy difference of at least 0.05 eV, when $Ar_1$, $Ar_2$, and $Ar_3$ have a substituent or substituents, at least one of the substituents should be an alkoxy group, an alkylthio group, an aryloxy group or a heterocyclic compound group having 4 or more carbon atoms or one or two of $Ar_1$, $Ar_2$ and $Ar_3$ should be chosen from heterocyclic compound groups.

Reference is then made to the case where $Ar_4$, $Ar_5$, and $Ar_6$ are different from one another and have a substituent or substituents. If, in this case, at least one of the substituents is an alkoxy group, an alkylthio group, an aryloxy group or a heterocyclic compound group having 4 or more carbon atoms or either one of $Ar_4$ and $Ar_6$ is a heterocyclic compound group, it is then possible to obtain a conjugated polymer showing a high fluorescence yield.

In the invention, the conjugated polymer may be in a random, block or graft copolymer form, or may have a structure positioned halfway between them or, in another parlance, may be a random copolymer also regarded as being a block copolymer. In the interest of obtaining a copolymer having high fluorescent quantum efficiency, a random copolymer also regarded as being a block copolymer, or a block or graft copolymer is preferable to a perfect random copolymer.

For solvents preferable for the polymeric fluorescent substance according to the invention, for instance, chloroform, methylene chloride, dichloroethane, tetrahydrofuran, toluene, and xylene are exemplified. The amount of the polymeric fluorescent substance dissolved in these solvents are usually at least 0.1 wt % although depending on its structure or molecular weight. To obtain a polymer excellent in film formation capabilities such as solvent solubility, at least one of $Ar_1$, $Ar_2$ and $Ar_3$ or $Ar_4$, $Ar_5$ and $Ar_6$ combinations should preferably be an aryl or heterocyclic compound group whose nucleus is substituted by one or more substituents selected from an alkyl, alkoxy or alkylthio group having 4 to 22 carbon atoms, an aryl or aryloxy group having 6 to 60 carbon atoms or a heterocyclic compound group having 4 to 60 carbon atoms.

Examples of these substituents are given just below. Exemplary alkyl groups having 4 to 22 carbon atoms are butyl, pentyl, hexyl, heptyl, octyl, decyl, and lauryl groups, among which the pentyl, hexyl, heptyl, and octyl groups are preferred. Exemplary alkoxy groups having 4 to 22 carbon atoms are butoxy, pentyloxy, hexyloxy, heptyloxy, octyloxy, decyloxy, and lauryloxy groups, among which the pentyloxy, hexyloxy, heptyloxy, and octyloxy groups are preferred. Exemplary alkylthio groups are butylthio, pentylthio, hexylthio, heptylthio, octylthio, decylthio, and laurylthio groups, among which the pentylthio, hexylthio, heptylthio, and octylthio groups are preferred. Exemplary aryl groups are a phenyl group, 4-$C_1$ to $C_{12}$ alkoxyphenyl groups where $C_1$ to $C_{12}$ stand for 1 to 12 carbon atoms, a 1-naphthyl group, and a 2-naphthyl group. An exemplary aryloxy group is a phenoxy group. Exemplary heterocyclic compound groups are 2-thienyl, 2-pyrolyl, 2-furyl, and 2-, 3- or 4-pyridyl groups.

These substituents should preferably be selected such that the repeating unit has an optical absorption edge energy difference of at least 0.05 eV upon homopolymerization, as already explained. In the interest of obtaining a copolymer of high solubility, the repeating unit having these substituents should account for 5 to 100 mol %, and preferably 15 to 100 mol % of the copolymer.

The degree of polymerization of the polymer according to the invention is not particularly limited, and so varies with its repeating arrangements or ratio. In view of film formation capabilities, the total number of repeating arrangements is of generally 3 to 10,000, preferably 3 to 3,000, and more preferably 4 to 2,000.

For the formation of a film form of organic EL device from a solution using such a polymer soluble in organic solvents, only the coating of the solution and removal of the solvent by drying are needed. When the charge transporting layer is used in combination therewith, too, similar procedures may be used. Thus, the present invention is very favorable for device production.

An arylene-vinylene copolymer is typical of the copolymer according to the invention. Preferably but not exclusively, this copolymer should be synthesized making use of a process similar to those disclosed in JP-A's 1-254734 and 1-79217. For instance, the copolymer may be synthesized by a dehydrohalogenation process wherein two or more corresponding bis(halogenated methyl) compounds, e.g., 2,5-diethyl-P-xylylene dibromide, 2,5-diheptyloxy-P-xylylene dibromide and p-xylylene dibromide are copolymerized in a xylene/tert-butyl alcohol solvent mixture, using tert-butoxypotassium. In this case, a random copolymer is usually obtained. If an oligomer is used, on the other hand, it is then possible to obtain a block copolymer.

The arylene-vinylene copolymer may also be synthesized by the Witting reaction wherein corresponding bis(halogenated methyl) compounds, for instance, 2,5-diethyl-p-xylylene dibromide and 2,5-diheptyloxy-P-xylylene dibromide are first allowed to react with triphenylphosphine in an N,N-dimethylformamide solvent to synthesize a phosphonium salt, and a corresponding dialdehyde compound, for instance, terephthalaldehyde is then polymerized in ethyl alcohol using lithium ethoxide. Further, the copolymer may be obtained by reactions of two or more diphosphonium salts and/or two or more dialdehyde compounds. Furthermore, the copolymer may be obtained by a sulfonium salt decomposition process wherein a corresponding sulfonium salt is first polymerized in the presence of an alkali, and the resultant polymer is then treated for elimination of the sulfonium salt. When these polymers are used as a light emitting layer for an organic EL device, it desired that they be subjected to post-synthesis purification treatments such as purification by re-precipitation, and fractionation by chromatography, because their purity has influences on light emission performance.

The organic EL device fabricated using the light emitting layer according to the invention may have any known structure provided that the light emitting material comprising the aforesaid polymer is incorporated in a light emitting layer interleaved between a pair of electrodes at least one of which is transparent or translucent, and the aforesaid high-resistance electron injecting layer is provided. For instance, an electron transporting layer containing an electron transporting material may be provided between a light emitting layer comprising the aforesaid polymeric fluorescent substance or a light emitting layer comprising a mixture of this polymeric fluorescence substance and an electron transporting material (which is a general name for both an electron transporting material and a hole transporting material) and an electron injecting electrode, or the aforesaid high-resistance inorganic electron injecting layer may be provided between a light emitting layer and an electron injecting electrode. In addition, a hole transporting layer including a hole transporting material may be provided between the light emitting layer and the hole injecting electrode in a laminating fashion.

In the invention, the light emitting layer or the charge transporting layer may be provided in a single layer or multilayer form. For instance, light emitting materials other than the polymeric fluorescent substance mentioned below, too, may be mixed and used with the light emitting layer. The polymeric fluorescent substance and/or the charge transporting material may also be dispersed in a polymer compound to form a layer.

For the charge transporting material used with the polymer according to the invention, i.e., for the electron or hole transporting material, use may be made of any known materials. By way of example but not by way of limitation, pyrazoline derivatives, arylamine derivatives, stilbene derivatives, and triphenyldiamine derivatives are used for the hole transporting material, and oxadiazole derivatives, anthraquinodimethane or its derivatives, benzoquinone and its derivatives, naphthoquinone and its derivatives, tetracyanoanthraquinodimethane and its Derivatives, fluorenone derivatives, diphenydicyanoethylene and its derivatives, diphenoquinone derivatives, and metal complexes of 8-hydroxyquinoline and its derivatives are used for the electron transporting material.

More illustratively, use may be made of those disclosed in JP-A's 63-70257, 63-175860, 2-135359, 2-135361, 2-209988, 3-37992 and 3-152184. A preferable hole transporting material is a triphenyldiamine derivative, and preferable electron transporting materials are an oxadiazole derivative, benzoquinone and its derivative, anthraquinone and its derivative, and metal complexes of 8-hydroxyquinoline and its derivative. A particularly preferable hole transporting material is 4,4-bis(N(3-methylphenyl)-N-phenylamino)biphenyl, and particularly preferable electron transporting materials are 2-(4-biphenylyl)-5-(4-t-butylphenyl)-1,3,4-oxadiazole, benzoquinone, anthraquinone and tris(8-quinolinol) aluminum. Of these, either one of the compounds capable of transporting electron and holes should preferably be used. Both such compounds may be used at the same time. These materials may be used singly or in admixture of two or more.

When a charge injecting layer comprising an organic material is located between the light emitting layer and the electrode, this organic charge injecting layer may be formed using these charge transporting materials. When the charge transporting material is mixed and used with the light emitting layer, it is required that the amount of the charge transporting material be determined such that sufficient film formation capabilities and light emission performance are ensured, because its amount varies with the type, etc. of the compound used. Usually, the charge transporting material should be used in an amount of preferably 1 to 40% by weight, and more preferably 2 to 30% by weight relative to the light emitting material.

By way of example but not by way of limitation, known light emitting materials used with the polymeric fluorescent substance according to the invention include naphthalene derivatives, anthracene and its derivatives, perylene and its derivatives, polymethine-, xanthene-, coumarin- and cyanine-base dyes, metal complexes of 8-hydroxyquinoline and its derivatives, aromatic amine, tetraphenylcyclopentadiene and its derivatives, and tetraphenylbutadiene and its derivatives. More illustratively, use may be made of those known from JP-A's 57-51781 and 59-194393.

The light emitting layer comprising as the light emitting material the aforesaid polymer optionally with the charge transporting material is formed on the electrode. To this end, various coating techniques may be used, as represented by spin coating, casting, dipping, bar coating, and roll coating processes wherein solutions, solution mixtures, and melts of these materials are used. Most preferably, however, the solutions or solution mixtures should be formed into films by means of coating processes such as spin coating, casting, dipping, bar coating, and roll coating processes.

The light emitting layer formed by use of the aforesaid conjugated polymeric fluorescent substance should have a thickness of 0.5 nm to 10 $\mu$m, and especially 1 nm to 1 $\mu$m. To increase current density and thereby enhance light emission efficiency, the thickness should preferably be in the range of 10 to 500 nm. It is here roted that when a thin film form of light emitting layer is obtained by a coating process, it is desired that the thin film be heated and dried at a temperature of 30 to 200° C., preferably 60 to 100° C. under reduced pressure or in an inert atmosphere, thereby removing the solvent. When such a heating and drying step is needed, it is preferable to provide the inorganic charge injecting layer mentioned below between the light emitting layer and the electrode.

In the organic EL device of the invention, the high-resistance inorganic electron injecting and transporting layer is incorporated between the light emitting layer and one of the electrodes, i.e., the cathode.

By locating between the organic layer and the electron injecting electrode (cathode) the inorganic electron injecting and transporting layer having electron conduction paths and capable of blocking holes, it is thus possible to inject electrons in the light emitting layer with high efficiency, resulting in light emission efficiency improvements and a lowering of driving voltage.

The conduction path should preferably be formed by using the second component of the high-resistance inorganic electron injecting and transporting layer in an amount of 0.2 to 40 mol % relative to all components thereof, so that electrons can be injected, with high efficiency, from the electron injecting electron in the organic layer on the light emitting layer side. In addition, migration of holes from the organic layer to the electron injecting electrode can be inhibited, thereby ensuring efficient recombination of holes and electrons in the light emitting layer. Furthermore, it is possible to achieve an organic EL device having the merits of both the inorganic material and the organic material. The organic EL device of the invention has luminance equivalent to or higher than that of a device comprising a prior art organic electron injecting layer, and is higher in heat resistance and weather resistance than such a device. Thus, the EL device of the invention is longer in service life than the prior art device and less susceptible to leakage and dark spots than the prior art device. Moreover, the organic EL device of the invention can be fabricated at lower costs because not only a relatively expensive organic material but also inexpensive, easily available, and easy-to-produce inorganic material can be used.

The inorganic electron injecting and transporting layer of high resistance should preferably have a resistivity of 1 to $1 \times 10^{11}$ Ω·cm, and especially $1 \times 10^3$ to $1 \times 10^8$ Ω·cm. By limiting the resistivity of the inorganic electron injecting and transporting layer of high resistance to the above range, it is thus possible to achieve remarkable improvements in electron injection efficiency while high electron block capabilities are kept. The resistivity of the inorganic electron injecting and transporting layer of high resistance may be found from sheet resistance and thickness.

The high-resistance inorganic electron injecting and transporting layer should preferably comprise as the first component an oxide which has a work function of 4 eV or lower, and preferably 1 to 4 eV, and is selected from the group consisting of:

an oxide or oxides of at least one alkali metal element selected from the group consisting of L:i, Na, K, Rb, Cs, and Fr, an oxide or oxides of at least one alkaline earth metal element selected from the group consisting of Mg, Ca, and Sr, and an oxide or oxides of at least one lanthanide element selected from the group consisting of La, and Ce. Of these oxides, lithium oxide, magnesium oxide, calcium oxide and cerium oxide are most preferred. In use, they may be mixed at any desired ratio. The mixture should the preferably contain lithium oxide in an amount of at least 50 mol % as calculated in the form of $Li_2O$.

The high-resistance inorganic electron injecting and transporting layer should preferably cortain as the second component at east one element selected from the group consisting of Zn, Sn, V, Ru, Sm, and In. The content of the second component should then be preferably 0.2 to 40 mol %, and more preferably 1 to 20 mol %. At a lower content the function of injecting electrons becomes worse and at a higher content the function of blocking holes becomes worse. When two or more elements are used in combination, it is preferred that the total content of the elements be within the above range. The second component may be present in the form of either a metal element or an oxide.

The incorporation of the electrically conductive (low-resistance) second component in the first component of high resistance allows the conductive material to take an island from in the insulating material. This is then believed to create a hopping path for electron injection.

Although the first component oxide has usually a stoichiometric composition, yet it may deviate slightly from the stoichiometric composition or it may have a non-stoichiometric composition. The same also holds for the second component oxide although it is usually present in the form of an oxide.

The high-resistance inorganic electron injecting and transporting layer may further contain as impurities H, and Ne, Ar, Kr, Xe, etc. used for sputtering gases in a total amount of 5 at % or less.

It is to be noted that if the high-resistance inorganic electron injecting and transporting layer has such an average composition as a whole, it is then acceptable that the layer is not uniform or has a concentration gradient in the thickness direction.

The high-resistance inorganic electron injecting and transporting layer is usually in an amorphous state.

The inorganic electron injecting and transporting layer of high resistance should preferably a thickness of about 0.2 to 30 nm, and especially about 0.2 to 20 nm. Too large or small a thickness does not allow the electron injecting layer to make full use of its own function.

The high-resistance inorganic electron injecting and transporting layer may be fabricated by various physical or chemical thin-film formation techniques such as a sputtering technique, and an evaporation technique, with the sputtering technique being preferred. Particular preference is given to a multi-sputtering technique wherein targets for the first and second components are separately sputtered. In the multi-sputtering technique, suitable sputtering processes can be applied to the respective targets. In a single sputtering technique, it is preferable to use a mixed target wherein the first and second components are mixed together.

When the high-resistance inorganic electron injecting and transporting layer is formed by means of the sputtering technique, the gas pressure for sputtering should preferably be in the range of 0.1 to 1 Pa. For the sputtering gas, inert gases used with ordinary sputtering systems, for instance, Ar, Ne, Xe, and Kr may be used, if required, together with $N_2$. For a reactive sputtering process, these sputtering gases may be mixed with about 1 to 99% of $O_2$ to provide a sputtering atmosphere.

For the sputtering technique, an RF sputtering process using an RF power source, a DC sputtering process, etc. may be used. A sputtering system should preferably be operated at 0.1 to 10 W/cm² for RF sputtering, with a film deposition rate of 0.5 to 10 nm/min., and especially 1 to 5 nm/min.

A substrate should be set in the range of room temperature (25° C.) to about 150° C. during film deposition.

In another organic EL device embodiment of the invention, a high-resistance hole injecting and transporting layer may be interleaved between the light emitting layer and a pair of electrodes.

By locating between the organic layer and the hole injecting electrode the high-resistance inorganic hole injecting and transporting layer having hole conduction paths and capable of blocking electrons, it is thus possible to inject holes in the light emitting layer with high efficiency, resulting in further improvements in light emission efficiency and a lowering of driving voltage.

Preferably, an oxide of a metal such as silicon, and germanium or a semi-metal should be used as a main component of the high-resistance inorganic hole injecting and transporting layer and at least one of a metal having a work function of at least 4.5 eV, preferably 4.5 to 6 eV, a semi-metal and/or an oxide, carbide, nitride, silicide and boride thereof should be incorporated into the layer, thereby forming an electrical conduction path, so that holes can efficiently be injected from the hole injecting electrode in the organic layer on the light emitting layer. In addition, migration of holes from the organic layer to the hole injecting electrode can be inhibited, thereby ensuring efficient recombination of holes and electrons in the light emitting layer. Furthermore, it is possible to achieve an organic EL device having the merits of both the inorganic material and the organic material. The organic EL device of the invention has luminance equivalent to or higher than that of a device comprising a prior art organic electron injecting and transporting layer, and is higher in heat resistance and weather resistance than such a device. Thus, the EL device of the invention is longer in service life than the prior art device and less susceptible to leakage and dark spots than the prior art device. Moreover, the organic EL device of the invention can be fabricated at lower cost because not only a relatively expensive organic material but also an inexpensive, easily available, and easy-to-produce inorganic material can be used.

The inorganic hole injecting and transporting layer of high resistance should preferably have a resistivity of 1 to $1 \times 10^{11}$ $\Omega \cdot$cm, and especially $1 \times 10^{3}$ to $1 \times 10^{3}$ $\Omega \cdot$cm. By limiting the resistivity of the inorganic hole injecting and transporting layer of high resistance to the above range, it is thus possible to achieve remarkable improvements in hole injection efficiency while high electron block capabilities are kept. The resistivity of the inorganic hole injecting and transporting layer of high resistance may be found from sheet resistance and thickness. In this case, the sheet resistance may be measured as by a four-terminal method.

The main component material is an oxide or oxides of silicon and germanium, and should preferably be represented by $(Si_{1-x}Ge_x)O_y$ wherein $0 \leq x \leq 1$ and $1.7 \leq y \leq 2.2$, preferably $1.7 \leq y < 1.99$. The main component of the high-resistance inorganic hole injecting and transporting layer may be either silicon oxide and/or germanium oxide. When y deviates from this range, the hole injection function tends to become low. The composition in this case may be determined by Rutherford back scattering, chemical analysis, etc.

In addition to the main component, the high-resistance inorganic hole injecting and transporting layer should preferably contain an oxide, carbide, nitride, silicide and boride of a metal (inclusive of a semi-metal) having a work function of at least 4.5 eV. The metal having a work function of at least 4.5 eV, preferably 4.5 to 6 eV should preferably be at least one metal selected from Au, Cu, Fe, Ni, Ru, Sn, Cr, Ir, Nb, Pt, W, Mo, Ta, Pd and Co. These are generally present in the form of metals or oxides. Carbides, nitrides, silicides and borides of these metals, too, may be used. The content of each metal should be preferably 0.2 to 40 mol %, and more preferably 1 to 20 mol %. At a smaller content the hole injection function becomes low, and at a larger content the electron block function becomes low. When these metals are used in combination of two or more, their total content should be in the aforesaid range.

The aforesaid metal or the oxide, carbide, nitride, silicide, and boride of the metal (inclusive of a semi-metal) are usually dispersed in the high-resistance inorganic hole injecting and transporting layer. The dispersed particles have usually a particle diameter of the order of 1 to 5 nm. It appears that between the conductive dispersed particles there is a hopping path for delivering holes by way of the main component of high resistance.

The high-resistance inorganic hole injecting and transporting layer may further contain ELS impurities H, and Ne, Ar, Kr, Xe, etc. used for sputtering gases in a total amount of 5 at % or less.

It is to be noted that if the high-resistance inorganic hole injecting and transporting layer has such an average composition as a whole, it is then acceptable that the layer is not uniform or has a concentration gradient in the thickness direction.

The high-resistance inorganic hole injecting and transporting layer is usually in an amorphous state.

The inorganic hole injecting and transporting layer of high resistance should preferably have a thickness of about 0.3 to 100 nm, especially 1 to 100 nm, and more especially about 5 to 30 nm. Too large or small a thickness does not allow the hole injecting and transporting layer to make full use of its own hole injecting function.

The high-resistance inorganic hole injecting and transporting layer may be fabricated by various physical or chemical thin-film formation techniques such as a sputtering technique, and an evaporation technique, with the sputtering technique being preferred. Particular preference is given to a multi-sputtering technique wherein targets for the main component and the metal or metal oxide, etc. are separately sputtered. In the multi-sputtering technique, suitable sputtering processes can be applied to the respective targets. In a single sputtering technique, it is preferable to gain composition control by suitable regulation of the area ratio of a main component target and a small piece of the metal, metal oxide or the like placed on the target.

When the high-resistance inorganic hole injecting and transporting layer is formed by means of the sputtering technique, the gas pressure for sputtering should preferably be in the range of 0.1 to 1 Pa. For the sputtering gas, inert gases used with ordinary sputtering systems, for instance, Ar, Ne, Xe, and Kr may be used, if required, together with $N_2$. For a reactive sputtering process, these sputtering gases may be mixed with about 1 to 99% of $O_2$ to provide a sputtering atmosphere.

For the sputtering technique, an RF sputtering process using an RF power source, a DC sputtering process, etc. may be used. A sputtering system should preferably be operated at 0.1 to 10 W/cm$^2$ for RF sputtering, with a film deposition rate of 0.5 to 10 nm/min. and especially 1 to 5 nm/min.

A substrate should be set in the range of room temperature (25° C.) to about 150° C. during film deposition.

The organic EL device of the invention, because of comprising the high-resistance inorganic hole injecting and transporting layer, can be improved in terms of heat resistance and weather resistance and, hence, service life. By using an inexpensive, easily available inorganic material rather than a relatively expensive organic material, device production can be facilitated, resulting in product cost reductions. Satisfactory connections with the electrodes formed of inorganic materials, which is one prior art problem, too, are well achievable. This in turn can prevent occurrence of leakage currents and dark spots.

The organic EL device of the invention may comprise, in addition to the aforesaid light emitting layer, a high-resistance inorganic electron injecting layer plus an organic electron transporting layer or an organic hole injecting and transporting layer that is a replacement to the high-resistance inorganic hole injecting and transporting layer.

For the electron injecting and transporting layer and the hole injecting and transporting layer, each formed of an organic material, it is preferable to use the following materials capable of injecting and transporting electrons, and holes.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$). It is also preferable to use the aforesaid phenylanthracene derivatives, and tetraarylethene derivatives.

The electron injecting and transporting compounds used herein may include quinoline derivatives such as organic metal complexes containing quinoline derivatives, especially 8-quinolinol or its derivatives as ligands, in particular, tris(8-quinolinolato) aluminum ($Alq^3$), oxadiazole derivatives, perylene derivatives, pyridine derivatives, pyrimidine derivatives, quinoxaline derivatives, diphenylquinone derivatives, and nitro-substituted fluorene derivatives.

When a heat polymerization step is necessary for the formation of the light emitting layer with the electron injecting and transporting layer located beneath it, the electron injecting and transporting layer should have a certain heat resistance. Preferably in this case, an electron injecting and transporting compound having a glass transition temperature of at least 200° C., preferably at least 300° C., and more preferably at least 350° C. should be used.

For the compounds for the injection and transportation of holes, it is preferable to use amine derivatives having strong fluorescence, for instance, hole transporting compounds such as triphenyldiamine derivatives, styrylamine derivatives, and amine derivatives havirg an aromatic fused ring.

The hole injecting and transporting compound used herein may include various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. These compounds may be used singly or in combination of two or more. Where two or more such compounds are used, they may be stacked as separate layers, or otherwise mixed.

When a heat polymerization step is necessary for the formation of the light emitting layer with the hole injecting and transporting layer located beneath it, the hole injecting and transporting layer should have a certain heat resistance. Preferably in this case, a hole injecting and transporting compound having a glass transition temperature of at least 200° C., preferably at least 300° C., and more preferably at least 350° C. should be used. Such a compound, for instance, may be polyaniline.

Preferably but not exclusively, the thickness of the organic hole transporting layer and the thickness of the electron injecting and transporting layer should be of the order of usually 5 to 500 nm, and especially 10 to 300 nm, although varying with formation techniques. When a hole injecting layer and a hole transporting layer are separately provided, it is preferable that the injecting and transporting layers have each a thickness of at least 1 nm. The upper limit to thickness is usually about 500 nm for the injecting layer, and about 500 nm for the transporting layer.

Preferably, the organic hole injecting and transporting layer, and the electron transporting layer are formed by a vacuum evaporation process because a uniform thin film can then be obtained. With the vacuum evaporation process, it is thus possible to obtain a uniform thin film in an amorphous state or with a grain size of up to 0.2 $\mu$m. A grain size of greater than 0.2 $\mu$m results in non-uniform light emission. To avoid this, it is required to make the driving voltage of the device high. However, this in turn gives rise to some considerable drop of hole or electron injection efficiency.

No special limitation is imposed to conditions for vacuum evaporation. However, the vacuum evaporation should preferably be carried out at a degree of vacuum of up to $10^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

Preferably, the device is sealed up by means of a sealing sheet, etc. for the purpose of preventing degradation of the organic layers and electrodes in the device. To prevent penetration of moisture, the sealing sheet is bonded to the device using an adhesive resin layer to seal up the device. An inert gas such as Ar, He, and $N_2$ is preferably used as a sealing gas. Then, the sealing gas should preferably have a moisture content of up to 100 ppm, especially up to 10 ppm, and more especially up to 1 ppm. Although there is no particular lower limit to the moisture content, the sealing gas should usually have a moisture content of about 0.1 ppm.

The sealing sheet, preferably in a flat sheet form, may be made of transparent or translucent materials such as glasses, quartz, and resins, among which the glasses are preferred. For such glass materials, alkali glass is preferable from a cost standpoint. Other preferable glass materials, for instance, include soda lime glass, lead alkali glass, borosilicate glass, aluminosilicate glass, and silica glass. In particular, a soda glass material subjected to no surface treatment is inexpensive and so is preferable. A metal sheet, a plastic sheet or the like, too, may be used in place of the sealing glass sheet.

For height control, a spacer is used to keep the sealing sheet at a height as desired. The spacer material may be resin beads, silica beads, glass beads, glass fibers, etc., with the glass beads being most preferred. The spacer is usually in a particulate form having a uniform particle size. In the invention, however, a spacer of any desired shape may be used provided that it can function well. The spacer size should preferably be 1 to 20 $\mu$m, especially 1 to 10 $\mu$m, and more especially 2 to 8 $\mu$m as calculated on a circle diameter basis. A spacer having such a diameter should preferably have a particle length of up to about 100 $\mu$m. Although there is no particular lower limit to the particle size, the particle size should usually be equal to or larger than the diameter.

The spacer may or may not be used when recesses are provided in the sealing sheet. When the spacer is used, its size is preferably within the aforesaid range, and more preferably within the range of 2 to 8 µm.

The spacer may have been incorporated in the sealing adhesive agent or may be incorporated in the sealing adhesive agent at the time of bonding. The content of the spacer in the sealing adhesive agent should be preferably 0.01 to 30 wt %, and more preferably 0.1 to 5 wt %.

For the adhesive agent, it is preferable to use a cation curing epoxy resin of the ultraviolet curing type, although an adhesive agent of the type that ensures stable adhesion strength and good airtightness may be used.

For the substrate on which an orgaric EL structure is formed according to the invention, a noncrystalline substrate such as a glass or quartz substrate, and a crystalline substrate such as an Si, GaAs, ZnSe, ZnS, GaP or InP substrate may be used. The crystalline substrate may also be provided with a crystalline or noncrystalline buffer layer or a metal buffer layer. For a metal substrate, Mo, Al, Pt, Ir, Au, Pd, and other metal substrates may be used. However, it is preferable to use a glass substrate. The substrate is usually located on the side out of which light is taken, and so it should preferably be transparent to light as in the above electrodes.

In the invention, a number of devices may be arranged on a plane. A color display may be constructed by changing the colors of light emitted from the devices arranged on the plane.

The substrate may be provided with a color filter film, fluorescent material-containing color conversion film or dielectric reflecting film for controlling the color of light emission.

For the color filter film, a color filter employed with liquid crystal display devices, etc. may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the fluorescent substance contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. When the color conversion filter film is provided on the substrate while it is in contact with the hole injecting electrode, it is also preferable to use a binder material that is not damaged during hole injecting electrode (ITO or IZO) film formation.

The light absorbing material is used when light is not fully absorbed by the fluorescent material, and so may be dispensed with, if not required. For the light absorbing material, it is preferable to make a selection from materials that do not extinguish fluorescence.

The organic EL device of the invention is generally of the DC drive type or pulse drive type while it may be of the AC drive type. The applied voltage is generally of the order of 2 to 30 volts.

Figure 2:
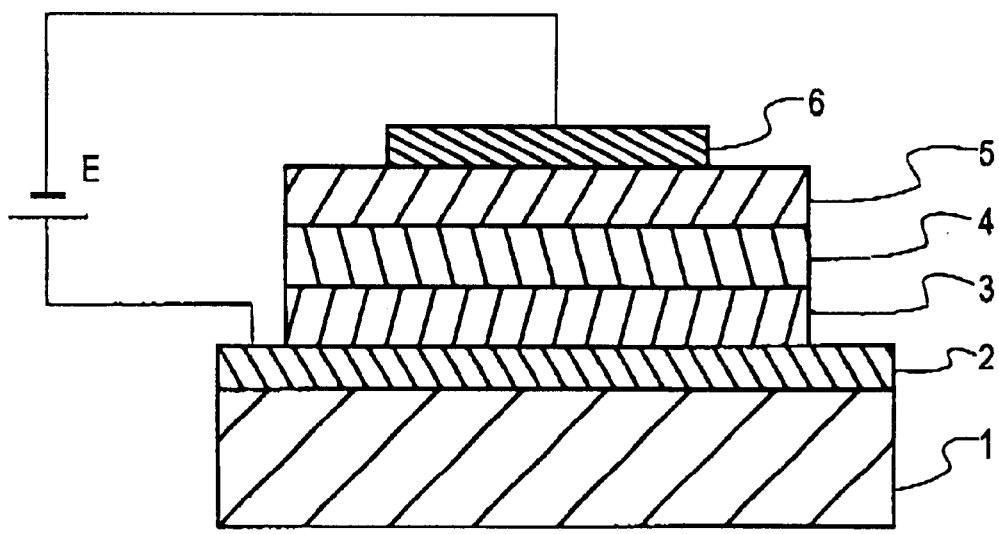
FIG. 2 is a sectional schematic of another basic embodiment of the organic EL device according to the invention.
Figure 3:
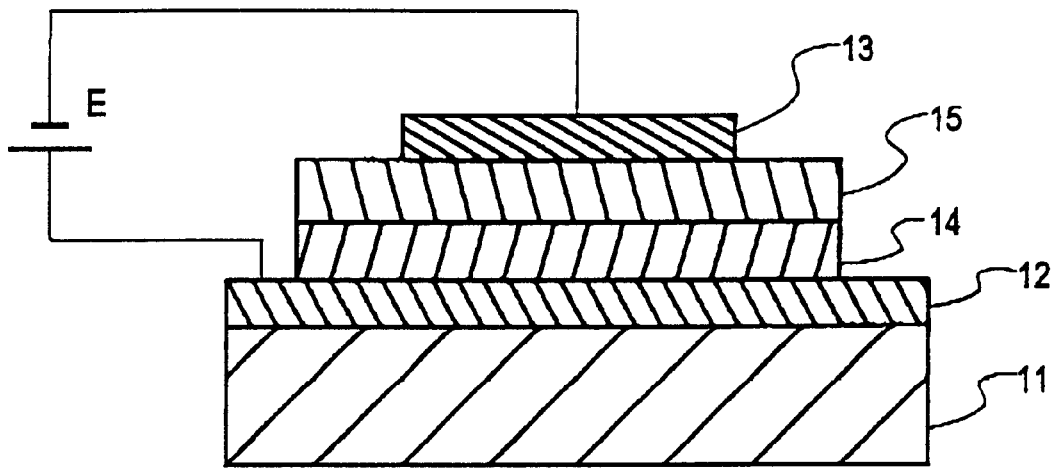
FIG. 3 is a sectional schematic of one architecture example of a prior art organic EL device.
Figure 4:
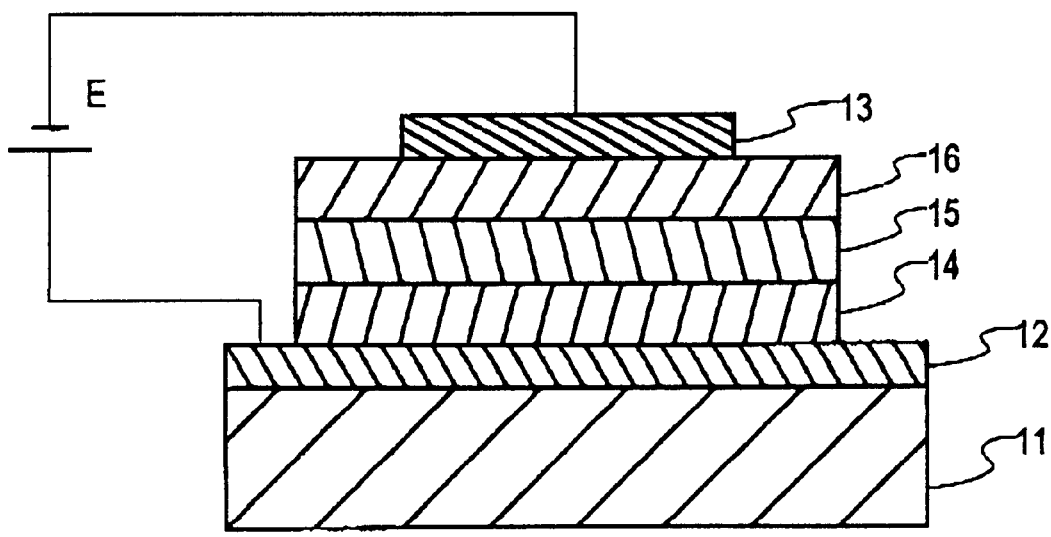
FIG. 4 is a sectional schematic of another architecture example of the prior art organic EL device.

The organic EL device of the invention may have such construction as shown in FIG. 1, wherein, in order from a substrate 1, a hole injecting layer 2, a light-emitting layer 4, a high-resistance inorganic electron injecting and transporting layer 5 and a cathode 6 are laminated or otherwise stacked on the substrate 1. Alternatively, the organic EL device may have such construction as shown in FIG. 2, wherein, in order from a substrate 1, a hole injecting electrode 2, a high-resistance inorganic hole injecting and transporting layer 3, a light emitting layer 4, a high-resistance inorganic electron injecting and transporting layer 5 and a cathode 6 are laminated or otherwise stacked on the substrate 1. This order of lamination may be reversed to set up a so-called reverse lamination structure. These may be appropriately selected, for instance, depending on display specifications, fabrication processes, etc. In FIGS. 1 and 2, a driving power source E is connected between the hole injecting electrode 2 and the electron injecting electrode 6.

If the devices of the invention are placed one upon another in the thickness direction, it is then possible to gain tone control of emitted light and obtain displays in multicolors.

The organic EL device or devices of the invention may be applied not only to display systems but also to various optical systems such as pickups used for reading/writing memories, photocouplers, and relay devices in optical communication transmission lines.

EXAMPLE

Example 1

A 7059 substrate (made by Corning) used as a glass substrate was scrubbed with neutral detergent.

At a substrate temperature of 250° C., an ITO hole injecting electrode layer of 200 nm in thickness was formed on the substrate by means of an RF magnetron sputtering process using an ITO oxide target.

Then, the substrate with the ITO electrode layer, etc. formed thereon was washed on its surface with $UV/O_3$, and then fixed to a substrate holder in a spin coater.

A PPV precursor methanol solution having a concentration of 1 gram per 10 to 25 grams of methanol was spin coated on the substrate with the ITO formed thereon. That is, the polymer solution was coated all over the surface of the substrate, and the substrate was then rotated to 5,000 r.p.m. while the upper surface thereof was kept horizontal for coating.

Then, the obtained substrate and polymer precursor layer were heated at a temperature of 300° C. for 12 hours in a vacuum oven. By this heat treatment, the precursor polymer was converted to PPV. The obtained PPV film had a thickness of 100 to 300 nm.

Then, the substrate was transferred to a sputtering system, which was evacuated to $1 \times 10^{-4}$ Pa or lower. Using an $Li_2O$ target with 4 mol % of V mixed therewith, a high-resistance inorganic electron injecting and transporting layer of 10 nm in thickness was formed on the substrate. This sputtering was carried out at room temperature (25° C.), a film deposition rate of 1 nm/min., an operating pressure of 0.2 to 2 Pa and a power input of 500 W, using a sputtering gas containing 30 sccm of Ar and 5 sccm of $O_2$. The thus obtained inorganic electron injecting and transporting layer was found to have much the same composition as the target.

With the vacuum still kept, Al was then deposited by evaporation to a thickness of 200 nm, thereby forming a cathode. Finally, the thus obtained EL structure was sealed up by glass to obtain an organic EL device.

When an electric field was applied to the obtained organic EL device in the air, it showed diode performance. When the device was biased with ITO on a positive side and Al electrode on a negative side, the current increased with increasing voltage, and distinct light emission was observed in an ordinary room. Even upon repetitive emission operations, no luminance decrease was found.

Upon measured by a four-terminal method, the high-resistance inorganic electron injecting layer was found to have a sheet resistance of 100 k$\Omega$/cm$^2$ at a sheet thickness of 100 nm, which corresponded to a resistivity of $1 \times 10^{10}$ $\Omega \cdot$cm.

Example 2

In Example 1, the substrate with the ITO electrode layer, etc. formed thereon was washed on its surface with UV/$O_2$, and then fixed to a substrate holder in a vacuum evaporation system which was in turn evacuated to $1 \times 10^{-4}$ Pa or lower.

A high-resistance inorganic hole injecting layer of 20 nm in thickness was formed following Example 1 with the exception that $SiO_2$ was used as a target with an Au pellet of given size placed thereon. This sputtering was carried out at room temperature (25° C.), a film deposition rate of 1 nm/min., an operating pressure of 0.2 to 2 Pa and a power input of 500 W, using a sputtering gas containing 30 sccm of Ar and 5 sccm of $O_2$. The thus obtained inorganic hole injecting layer was found to have a composition of $SiO_{1.9}$ with 4 mol % of Au contained in it.

Under otherwise similar conditions as in Example 1, an organic EL device was prepared.

When an electric field was applied to the obtained organic EL device in the air, it showed diode performance. When the device was biased with ITO on a positive side and Al electrode on a negative side, the current increased with increasing voltage, and distinct light emission was observed in an ordinary room. Even upon repetitive emission operations, no luminance decrease was found. In addition, it was found that the service life of this device was longer than that of the device in Example 1.

Upon measured by a four-terminal method, the high-resistance inorganic hole injecting layer was found to have a sheet resistance of 10 k$\Omega$/cm$^2$ at a sheet thickness of 100 nm, which corresponded to a resistivity of $1 \times 10^9$ $\Omega \cdot$cm.

Example 3

As in Examples 1 and 2, organic EL devices were prepared with the exception that the composition of each high-resistance inorganic electron injecting layer was changed from $Li_2O$ to an oxide or oxides of at least one element selected from alkali metal elements Na, K, Rb, Cs and Fr, or alkaline earth metal elements Be, Mg, Ca, Sr, Ba and Ra, or lanthanide elements La, Ce, Pr, Nd, Pm, Sm, Eu, Gd, Tb, Dy, Ho, Er, Tm, Yb and Lu. Similar results were obtained.

When the composition was changed from V to at least one element selected from Ru, Zn, Sm and In, too, similar results were obtained.

Example 4

As in Example 2, a high-resistance inorganic hole injecting layer of 20 nm in thickness was formed with the exception that $GeO_2$ was used as a target with an Au pellet of given size placed thereon. This sputtering was carried out at room temperature (25° C.), a film deposition rate of 1 nm/min., an operating pressure of 0.2 to 2 Pa and a power input of 500 W, using a sputtering gas containing 30 sccm of Ar and 5 sccm of $O_2$. The thus obtained inorganic hole injecting layer was found to have a composition of $GeO_2$ with 2 mol % of Au contained in it.

Under otherwise similar conditions as in Example 1, an organic EL device was prepared. The organic EL device was driven at a constant current density of 10 mA/cm2 in the air. As a result, it was found that an initial luminance of 880 cd/m$^2$ is obtained at a driving voltage 6.9 V.

Upon measured by a four-terminal method, the high-resistance inorganic hole injecting layer was found to have a sheet resistance of 100 $\Omega$/cm$^2$ at a sheet thickness of 100 nm, which corresponded to a resistivity of $1 \times 10^7$ $\Omega \cdot$cm.

Example 5

Organic EL devices were prepared as in Example 2 with the exception that high-resistance inorganic hole injecting and transporting layers were prepared at varying flow rates of sputtering gas $O_2$ while the main compositions of targets were changed to $SiO_{1.7}$, $SiO_{1.95}$ $GeO_{1.96}$, and $Si_{0.5}Ge_{0.5}O_{1.92}$, and estimated as in Example 1 in terms of light emission luminance. The results were substantially equivalent to those referred to in Example 1.

Example 6

Experiments were carried out following Example 1 with the exception that the metal in the high-resistance inorganic hole injecting layer was changed from Au to at least one of Cu, Fe, Ni, Ru, Sn, Cr, Ir, Nb, Pt, W, Mo, Ta, Pd and Co and oxides, carbides, nitrides, silicides and borides of these metals. In this example, too, similar results as in Example 1 were obtained.

Example 7

Synthesis of Polymeric Fluorescent Substance

A phosphonium salt (A) was synthesized by the reaction of 2,5-diethyl-P-xylylene dibromide with triphenylphosphine in an N,N-dimethylformamide solvent, and a phosphonium salt (B) was synthesized by the reaction of 2,5-diheptyloxy-p-xylylene dibromide with triphenylphosphine in an N,N-dimethylformamide solvent. The obtained two phosphonium salts (A) (4.1 parts by weight) and (B) (1.0 part by weight) and terephthalaldehyde (0.8 parts by weight) were dissolved in ethyl alcohol. For a 3-hour polymerization, an ethyl alcohol solution containing 0.8 parts by weight of lithium ethoxide was added dropwise to an ethyl alcohol solution of the phosphonium salts and dialdehyde at room temperature. After allowed to stand alone at room temperature overnight, the precipitate was filtered out, washec. with ethyl alcohol, and dissolved in chloroform, to which ethanol was added for re-precipitation. The obtained product was dried under reduced pressure to obtain 0.35 parts by weight of the end polymer. This is called a polymeric fluorescent substance 1. Set out below are the repeating unit in polymeric fluorescent substance 1 and its molar ratio calculated from the charge ratio of monomers.

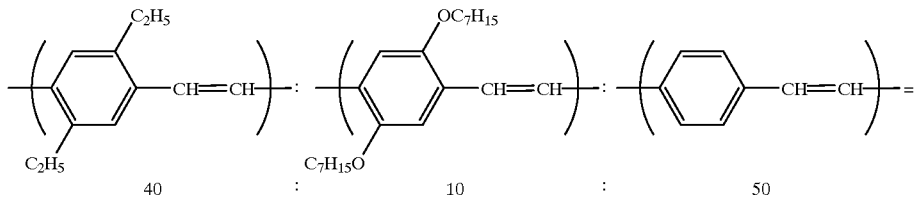

This polymeric fluorescent substance 1 had a number-average molecular weight of $5.0\times10^3$. From infrared absorption spectra for the structure of polymeric fluorescent substance 1, absorption of vinylene group was identified at 960 cm$^{-1}$, absorption of phenylene group at 1520 cm$^{-1}$, absorption of ether group at 1100 cm$^{-1}$, and absorption of alkyl group at 2860 cm$^{-1}$. From $^1$H-NMR measured using chloroform-d as a solvent, it was identified that H for the phenylenevinylene group is present around 6.5 to 8.0 ppm, H for —OCH$_2$— in the heptyloxy group around 3.5 to 4.0 ppm, and H for —CH$_2$— in the ethyl group around 2.5 ppm. The molar ratio of the repeating unit calculated from these strength ratios, etc. was in substantial agreement with the value calculated from the aforesaid monomer charge ratio.

An organic EL device was obtained following Example 1 with the exception that a 1.0 wt % chloroform solution of polymeric fluorescent substance 1 was used to form a PPV film. A light emitting layer was formed by coating the aforesaid solution to a thickness of 50 nm by a dipping process, and drying the film at 80° C. under reduced pressure for 1 hour.

Estimation of the obtained organic EL device as in Example 1 gave similar results.

EFFECTIVENESS OF THE INVENTION

According to the invention as explained above, it is possible to provide an organic EL device which possesses the merits of both an organic material and an inorganic material, has high efficiency and an extended life, and can be fabricated at low cost.

What is claimed is:

1. An organic EL device which comprises:
   a pair of a hole injecting electrode and a cathode and an organic layer interleaved between these electrodes and having at least a light emission function,
   said organic layer comprising a light emitting layer containing a conjugated polymer, and
   a high-resistance inorganic electron injecting and transporting layer interleaved between said organic layer and said cathode and being capable of blocking holes and having conduction paths for carring electrons.

2. The organic EL device according to claim 1, wherein said high-resistance inorganic electron injecting and transporting layer comprises as a first component at least one oxide having a work function of 4 eV or lower and selected from the group consisting of an alkali metal element, an alkaline earth metal element, and a lanthanide element, and as a second component at least one metal having a work function of 3 to 5 eV.

3. The organic EL device according to claim 2, wherein said second component is at least one element selected from the group consisting of Zn, Sn, V, Ru, Sm, and In.

4. The organic EL device according to claim 2, wherein said alkali metal element is at least one of Li, Na, K, Rb, Cs, and Fr, said alkaline earth metal element is at least one of Mg, Ca, and Sr, and said lanthanide element is at least one selected from the group consisting of La and Ce.

5. The organic EL device according to claim 1, wherein said high-resistance inorganic e ectron injecting and transporting layer has a resistivity of 1 to $1\times10^{11}$ $\Omega\cdot$cm.

6. The organic EL device according to claim 2, wherein said high-resistance inorganic electron injecting and transporting layer contains said second component in an amount of 0.2 to 40 mol % relative to all components thereof.

7. The organic EL device according to claim 1, wherein said high-resistance inorganic electron injecting and transporting layer has a thickness of 0.2 to 30 nm.

8. The organic EL device according to claim 1, wherein a high-resistance inorganic hole injecting and transporting layer is present between said organic layer and said hole injecting electrode, and is capable of blocking electrons and having a conduction path for carrying electrons.

9. The organic EL device according to claim 8, wherein said high-resistance inorganic hole injecting and transporting layer has a resistivity of 1 to $1\times10^{11}$ $\Omega\cdot$cm.

10. The organic EL device according to claim 8, wherein said high-resistance inorganic hole injecting and transporting layer contains at least one of a metal and/or an oxide, carbide, nitride, silicide and boride of said metal.

11. The organic EL device according to claim 8, wherein said high-resistance inorganic hole injecting and transporting layer contains as a main component an oxide of silicon and/or germanium as represented by $(Si_{1-x}Ge_x)O_y$ where $0\leq x<1$ and $1.7\leq y\leq 2.2$, and further contains at least one of a metal having a work function of at least 4.5 eV and/or an oxide, carbide, nitride, silicide and boride of said metal.

12. The organic EL device according to claim 10, wherein said metal is at least one selected from Au, Cu, Fe, Ni, Ru, Sn, Cr, Ir, Nb, Pt, W, Mo, Ta, Pd and Co.

13. The organic EL device according to claim 10, which contains said metal and/or said oxide, carbide, nitride, silicide and boride of said metal in an amount of 0.2 to 40 mol %.

14. The organic EL device according to claim 8, wherein said high-resistance inorganic hole injecting and transporting layer has a thickness of 0.2 to 100 nm.

* * * * *